US008411505B2

(12) United States Patent
Kamp

(10) Patent No.: US 8,411,505 B2
(45) Date of Patent: Apr. 2, 2013

(54) SELF-POWERED DETECTION DEVICE WITH A NON-VOLATILE MEMORY

(75) Inventor: David A. Kamp, Monument, CO (US)

(73) Assignee: EM Microelectronic-Marin SA, Marin (CH)

( * ) Notice: Subject to any disclaimer, the term of this patent is extended or adjusted under 35 U.S.C. 154(b) by 243 days.

(21) Appl. No.: 12/945,203

(22) Filed: Nov. 12, 2010

(65) Prior Publication Data

US 2011/0115540 A1 May 19, 2011

Related U.S. Application Data

(63) Continuation-in-part of application No. 12/620,365, filed on Nov. 17, 2009, now abandoned.

(30) Foreign Application Priority Data

Nov. 12, 2009 (EP) .................................... 09175792

(51) Int. Cl.
*G11C 11/34* (2006.01)

(52) U.S. Cl. .................. 365/185.04; 365/211; 365/196; 365/189.16

(58) Field of Classification Search ............. 365/185.04, 365/211, 196, 189.16
See application file for complete search history.

(56) References Cited

U.S. PATENT DOCUMENTS 5,317,303 A 5/1994 Ross et al.
6,046,676 A 4/2000 Ward et al.

(Continued)

FOREIGN PATENT DOCUMENTS

EP 0 592 097 A2 4/1994
WO 94/10686 5/1994
WO 01/45139 A2 6/2001

OTHER PUBLICATIONS

Office action issued in parent U.S. Appl. No. 12/620,365 on Jan. 9, 2012.

(Continued)

*Primary Examiner* — Vu Le
*Assistant Examiner* — Han Yang
(74) *Attorney, Agent, or Firm* — Griffin & Szipl, P.C.

(57) ABSTRACT

The self-powered detection device comprises a Non-Volatile Memory (NVM) unit (52) formed at least by a NVM cell and a sensor which is activated by a physical or chemical action or phenomenon, this sensor forming an energy harvester that transforms energy from said physical or chemical action or phenomenon into an electrical stimulus pulse, said NVM unit being arranged for storing in said NVM cell, by using the electrical power of said electrical stimulus pulse, a bit of information relative to the detection by said sensor, during a detection mode of the self-powered detection device, of at least one physical or chemical action or phenomenon applied to it with at least a given strength or intensity and resulting in a voltage stimulus signal provided between a set control terminal (SET) and a base terminal (SET *) of said NVM unit with at least a given set voltage. The self-powered detection device comprises a read circuit (56) or is arranged to be coupled to such a read circuit and further comprises a clamp circuit (54) located between the sensor and the NVM unit, this clamp circuit being arranged for passing said voltage stimulus signal on a set line connecting the sensor and the set control terminal of the NVM unit, this voltage stimulus pulse having a polarity corresponding to a set polarity of said NVM cell, and for blocking other voltage signals having approximately an amplitude corresponding to said set voltage or higher and an inverse polarity relative to the set polarity of said NVM cell, in order to avoid a possible erase of this NVM cell by such other voltage signals.

7 Claims, 9 Drawing Sheets

U.S. PATENT DOCUMENTS

| | | | |
|---|---|---|---|
| 6,735,802 | B1 | 5/2004 | Lundell et al. |
| 6,861,785 | B2 | 3/2005 | Andre et al. |
| 8,154,387 | B2 | 4/2012 | Van Eeden et al. |
| 2002/0190610 | A1 | 12/2002 | Andre et al. |
| 2008/0174281 | A1 | 7/2008 | Shau |
| 2009/0073760 | A1 | 3/2009 | Betser et al. |
| 2009/0121837 | A1 | 5/2009 | Kitayoshi et al. |
| 2011/0080775 | A1 * | 4/2011 | Bae et al. ...................... 365/163 |
| 2011/0110171 | A1 | 5/2011 | Kamp et al. |

OTHER PUBLICATIONS

European Search Report issued in counterpart European Application No. 09175792, completed Apr. 20, 2010.

European Search Report issued in related application EP10 19 1111 on Mar. 28, 2011.

Chan, T.Y. et al., "A True Single-Transistor Oxide-Nitride-Oxide EEPROM Device," IEEE Electron Device Letters, vol. EDL-8, No. 3, Mar. 3, 1987, pp. 93-95.

Notice of Allowance issued in co-pending related U.S. Appl. No. 12/945,138 on Aug. 24, 2012.

Notice of Allowance issued in co-pending related U.S. Appl. No. 12/945,168 on Sep. 4, 2012.

* cited by examiner

SELF-POWERED DETECTION DEVICE WITH A NON-VOLATILE MEMORY

This application is a Continuation-in-Part of U.S. patent application Ser. No. 12/620,365, filed Nov. 17, 2009, which claims priority from European Patent Application No. 09175792.2, filed Nov. 12, 2009, the entire disclosures of which are incorporated herein by reference.

FIELD OF THE INVENTION

The present invention concerns a self-powered detection device which comprises a sensor, activated by a physical or chemical action or phenomenon applied on it with at least a given strength or intensity, and a non-volatile memory (NVM) for storing information relative to the detection of at least one physical or chemical action or phenomenon detected by said sensor. In particular, the present invention concerns a tamper event detection device for detecting a penetration in a protected zone or in a closed case or container.

By 'self-powered detection device' it is understood that there is no need for an internal or external power source supplying the device for allowing its sensor to be activated and to detect a specific physical or chemical action or phenomenon. However, such a self-powered detection device can be supplied with power source for other functions in defined time periods, e.g. for reading the state of a memory or for resetting such a memory. In the following description of the invention, the physical or chemical action or phenomenon to which the sensor is sensitive is also named an external event. By 'external event' it is thus understood an action or a phenomenon that the sensor can detect, i.e. an action or a phenomenon applied on the sensing element of this sensor, and not an electrical signal from an external power source supplying the electronic circuit of such a sensor or a further electronic circuit associated to the sensor.

The invention further specifically deals with the reduction of the power consumption of self-powered detection devices and with the increase of their efficiency. In particular, the invention concerns such self-powered detection devices comprising a read circuit or being arranged to be coupled to such a read circuit for reading the state of the NVM and, in a particular case wherein the self-powered detection device can be reset, further comprising a reset circuit or being arranged to be coupled to such a reset circuit.

BACKGROUND OF THE INVENTION

The detection of an attempt to recover secrets from/within a protected zone, a closed case or a container through the use of an electronic circuit is often implemented by mechanical means external and adjacent to the electronic circuit which permanently records the attempt by changing a physical structure of, or related to this electronic circuit in a way not easily noticed by the perpetrator. This physical change can then be established by the fact that the electronic circuit is no longer functional or by measuring an electrical parameter of the electronic circuit that has been modified directly or indirectly by the mechanical means.

Another method for the detection of an external event consists of the integration of electrical detection means internal to the electronic circuit, powering this electronic circuit and waiting for the event to occur while powered. For example, the detection means can be a sensor that is configured to provide a detection signal when the sensor and the electronic circuit are powered, the occurrence of this signal being stored in a memory via a write control circuit which is also powered by a power source. Thus, the supply of power for the event detection device needs to be a battery or another power source supplying continuous power. Without such a power source or if the power source is OFF or if the energy stored in the battery becomes too low, this device will not be functional, i.e., it will be incapable of detecting and recording an event. It is indeed possible to limit the current consumption of such a detection device by implementing a 'sleep mode'. However the detection device will be functional only when supplied. Furthermore, in the case of an internal power source like a battery, such a device will have a limited lifetime or the internal power source will have to be changed after a certain time period. This causes a security problem first because there is a risk that the detection device becomes no longer functional when an interruption of the power supply occurs, and secondly because a perpetrator could cause an interruption of the power source, stopping the electrical supply of the detection device during the time period of the attempt.

The patent application EP 0 592 097 proposes a penetration detection system which overcomes the above mentioned problem concerning the power supply. This detection system comprises a sensing piezoelectric transducer and a memorizing piezoelectric transducer. The positive pole and the negative pole of the sensing piezoelectric transducer are respectively connected to the negative and positive poles of the memorizing piezoelectric transducer. The memorizing transducer comprises a layer of piezoelectric material having a thickness selected such that, upon mechanical probing of the sensing transducer, an electrical signal produced by this sensing transducer will be sufficient to effect a reversal in the poling of the memorizing transducer. This system defines a self-powered detection device. However, this detection device is expensive and not well adapted to be integrated in a small volume device because it comprises two distinct piezoelectric transducers. As shown in this patent application, these two transducers form two separate discrete units which are electrically connected and the memorizing transducer is linked to other classical electronic elements which are not manufactured with a same technology as this memorizing transducer. Thus, an integration of the memorizing piezoelectric transducer with further electronic elements, e.g. a reading circuit, will not be possible with a classical microelectronic process. Further, the reading means are complex and not adapted to integrated circuits.

The patent application US 2002/0190610 describes a self-powered remote control device comprising transmitting means, a feeder circuit connected to said transmitting means, a generator supplying electric power connected to the feeder circuit, and control means associated with the electric power generator. The generator comprises at least a piezoelectric element receiving mechanical stresses produced by actuating the control means and supplying electrical power to the feeder circuit. The feeder circuit comprises a rectifier bridge and a feeder capacitor in which the electrical energy provided by the piezoelectric element is accumulated and stored. In a particular embodiment, the remote control device further comprises a data management circuit associated with a memory and a counting circuit. To be functional, such a remote control device must receive a high amount of electrical energy to be stored in the feeder capacitor. The feeder circuit itself consumes some electrical energy as well as all others circuits of this device. Thus, the piezoelectric element needs to be able to generate a relatively high amount of electrical energy and the control means have to be actuated with a relatively high force for generating such a high amount of electrical energy. This limits the potential applications of this remote control device. Further such a control device is complex and expensive.

SUMMARY OF THE INVENTION

An object of the invention is to provide a self-powered detection device comprising at least a non-volatile memory cell and a sensor which is activated by a physical or chemical action or phenomenon, in particular a tamper event, and which needs only a small amount of electrical energy for setting the non-volatile memory in a secure way, this small amount of electrical energy being provided by the sensor when it detects said physical or chemical action or phenomenon applied to it with at least a given strength or intensity. In particular, the aim of the invention is to protect such a self-powered detection device from being reset in a non-authorized manner. Another aim of the invention is to ensure an efficient reading operation or an efficient reset operation when such operations are provided by the self-powered detection device.

Thus, the present invention concerns a self-powered detection device comprising a Non-Volatile Memory unit (NVM unit) formed at least by a NVM cell and a sensor which is activated by a physical or chemical action or phenomenon, this sensor forming an energy harvester that transforms energy from said physical or chemical action or phenomenon into an electrical stimulus pulse, the NVM unit being arranged for storing in said NVM cell, by using the electrical power of said electrical stimulus pulse, a bit of information relative to the detection by the sensor, during a detection mode of the self-powered detection device, of at least one physical or chemical action or phenomenon applied to it with at least a given strength or intensity and resulting in a voltage stimulus signal provided between a set control terminal and a base terminal of said NVM unit with at least a given set voltage. The self-powered detection device also comprises a read circuit or is arranged to be coupled to such a read circuit, This self-powered detection device further comprises a clamp circuit located between the sensor and said NVM unit, this clamp circuit being arranged for passing said voltage stimulus signal on a set line connecting the sensor and said set control terminal of the NVM unit, this voltage stimulus pulse having a polarity corresponding to a set polarity of said NVM cell, and for blocking other voltage signals having approximately an amplitude corresponding to said set voltage or higher and an inverse polarity relative to the set polarity of said NVM cell, in order to avoid a possible erase of this NVM cell by such other voltage signals.

In a first variant of the invention, the clamp circuit comprises a diode arranged between the ground of the sensor and said set line.

In a further variant, the clamp circuit is arranged also for blocking voltage signals with the set polarity and having voltage amplitude over a certain threshold, this threshold being higher than said set voltage, in order to protect the NVM unit by preventing damage to the electronic circuit of the detection device. In the case of the first variant, the diode is designed to break down at a certain threshold high enough to allow a set of said NVM cell but low enough to prevent damage of the detection device.

In a preferred embodiment, the clamp circuit is further arranged for maintaining its output to the ground or to a determined low level voltage in a read mode or in a reset mode of the detection device wherein this detection device is power supplied by a temporary power source. In this embodiment, the clamp circuit thus further defines a ground or determined low level clamp.

In a variant of the preferred embodiment, the clamp circuit comprises a first switch and a second switch, the first switch being arranged on said set line between the sensor and the set control terminal of the NVM unit, thus allowing the disconnection of the NVM unit from the sensor. The second switch is arranged between the set line and the ground or determined low level voltage of a temporary power source. These first and second switches are controlled so that when the first switch is turned on, or respectively turned off, the second switch is turned off, or respectively turned on. Further, the first and second switches are controlled so that the first switch is turned on when the clamp circuit receives said voltage stimulus signal when supplied by the temporary power source or not supplied.

In a further variant of the preferred embodiment, the first and second switches are respectively formed by two complementary transistors. The respective control gates of both complementary transistors are controlled by a control signal provided by a control part of the clamp circuit, this control part being arranged so that the control signal has a first state when the amplitude of the voltage signal inputting the clamp circuit is higher than a defined intermediate voltage of said temporary power source and a second opposite state when this amplitude is lower than this intermediate voltage.

It is to be noted that, in a specific embodiment of the invention, the sensor (or a part of this sensor, e.g. its circuitry) and an electronic circuit incorporating the non-volatile memory (NVM) can be integrated or incorporated in a unique electronic unit.

According to the invention, an energy harvester transforms the detected external event into electrical energy which is used to supply the electronic means arranged for storing the fact (setting a flag) that such an external event occurs. Here is a non-exhaustive list of the possible external events and related harvesters:

Electrical event: Electrostatic discharge;
Mechanical event: Piezoelectric element, dynamo;
Light event: Photodiode(s), solar cell(s);
Chemical event: Battery (detection of the mixing of ions);
Heat event: Thermopile;
Electromagnetic event: Antenna, rectifier, solenoid;
Pressure event: Barometer unit.

BRIEF DESCRIPTION OF THE DRAWINGS

Other features and advantages of the present invention will appear more clearly from the following detailed description of illustrative embodiments of the detection device according to the invention, given by way of non-limiting examples, in conjunction with the drawings in which.

DETAILED DESCRIPTION OF EMBODIMENTS OF THE INVENTION

Figure 1:
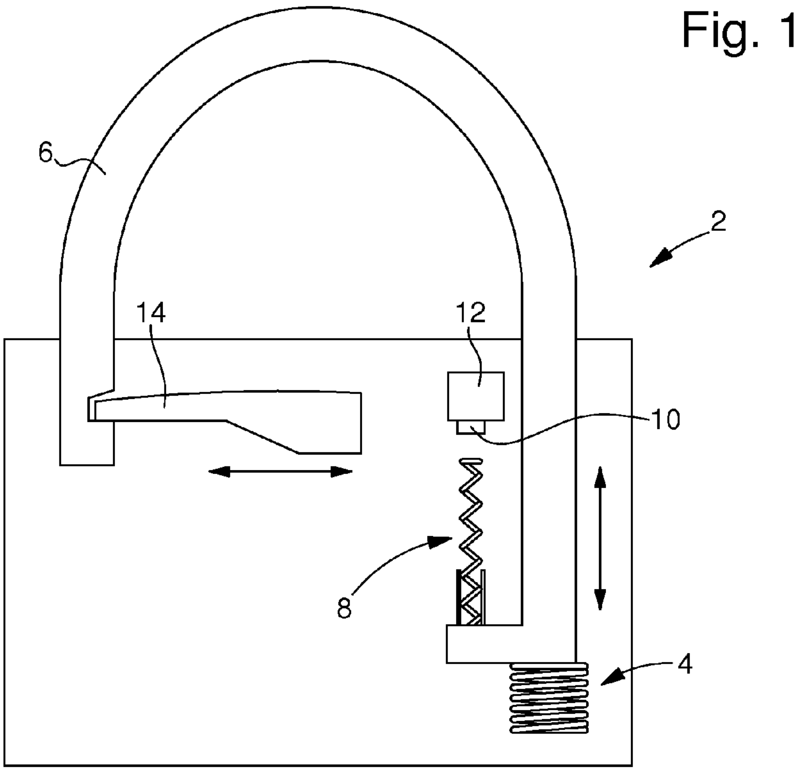
FIG. 1 shows a lock with a self-powered detection device according to the invention.

FIG. 1 shows schematically a lock 2, represented in its closed state, equipped with an external event detection device which comprises a sensor 10 and an electronic unit 12 according to the present invention. In this application, the sensor is formed by a piezoelectric element and associated circuitry arranged for providing an electrical power signal to the electronic unit when a certain pressure is applied on the piezoelectric element. This electrical power signal will be named '(electrical) stimulus signal' in the present description of the invention. In other words, the sensor 10 defines an energy harvester according to the present invention. This sensor transforms energy from an external event applied on it into electrical energy contained in an electrical stimulus pulse that forms an electrical stimulus signal provided to the electronic unit.

The aim of this detection device is to detect if a tamper event has occurred in a zone or in a case or container protected by this lock. If the lock is forced, i.e. tampered with, the spring 4 will push up the piece 6 and the spring 8 will apply a force on the piezoelectric element with at least a given strength or intensity. This external event is stored in a memory part of the detection device. Before opening the lock, an authorized user will have to first read the memory to know if a tamper event has occurred.

Figure 2:
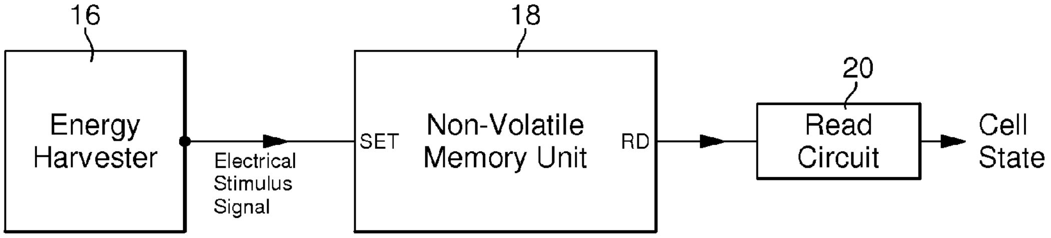
FIG. 2 shows the basic architecture of a first external event detection device without the present invention.

FIG. 2 shows the basic architecture of an external event detection device. The DC electrical energy of an external event is collected by the sensor forming an energy harvester 16 and provided to a memory part of the electronic unit, formed by a Non-Volatile Memory (NVM) unit 18 comprising at least one NVM cell, through an electrical stimulus signal line (set line). In the case of the lock of FIG. 1, this energy is provided by the force applied by the spring 8 on the piezoelectric element of the sensor 10. The memory part 18 is arranged for storing at least a bit of information or an item of data relative to at least one external event detected by the external event sensor 16. The electronic unit is arranged for storing said data by substantially using only the electrical energy contained in the electrical stimulus pulse generated by the external event acting on the sensor. Thus, the detection device of FIG. 2 defines a self-powered detection device. This is also the case for all embodiments of the invention that will be further described.

The electrical energy that the energy harvester (piezoelectric element and associated circuitry in the case of FIG. 1) has to give is the energy needed to raise the voltage on the input capacitance of the electronic unit corresponding to the switching voltage plus the energy needed to switch the NVM cell formed by a FET transistor and lost energy, i.e.:

Energy needed to raise the voltage on the input capacitance:

$$E_r = \frac{1}{2} C_{input} V_{sw}^2$$

where $C_{input}$ is the input capacitance $V_{sw}$ is the switching voltage

Typically, for an EEPROM technology:

$$E_r = \frac{1}{2}(20\ \text{pF})(16\ \text{V})^2 = 2.6\ nJ$$

Energy needed to switch the cell:

$$E_s = I_{sw} T_{sw} V_{sw}$$

where $I_{sw}$ is the switching current $T_{sw}$ is the switching time

Typically, for an EEPROM technology:

$$E_s = (100\text{nA})(5\text{ms})(16\text{V}) = 8\text{nJ}$$

So the total electrical energy needed to store a bit of information or an item of data in one FET transistor is typically of the order of 10 nJ.

For example, the piezoelectric element "PIC 151" (ceramic PZT), sold by the German company Physik Instrumente (PI), can be used to produce the needed energy and voltage to set a flag in the NVM cell. With an Input capacitance of 20 pF, 10 nJ can be generated by such a piezoelectric element having a capacity $C_{PZT}$ of approximately 19 pF, with a voltage value of approximately 16 V across this Input capacitance, by applying a force of about 1.25 N on the piezoelectric element. It is possible to generate more than 10 nJ, for instance 20 nJ with such a piezoelectric element by increasing the applied force. If needed, a force amplifier can be arranged between the piezoelectric element and the spring (i.e. the element generating an external force used by the energy harvester when an external event occurs). In case the piezoelectric element would generate a voltage significantly greater than the needed switching voltage for the memory cell, a protection element or circuit can be added between the piezoelectric element and the electronic unit or in an input part of such an electronic unit.

The electronic unit further comprises a readout circuit 20 allowing, when powered, the reading of the logical state of the NVM cell 18. The read circuit is only used during the reading phase (so only when the circuit is supplied). The read circuit is designed so that it will not interfere with the setting of the memory cell (whether the power supply is present or not). When the device is supplied, the read circuit will enable a read of the non-volatile memory cell and the output of the read circuit will return, e.g., a logical '0' if no tamper event occurred and a logical '1' if a tamper event has occurred. Since this circuit is here not resettable, it can detect only one tamper event.

Figure 3:
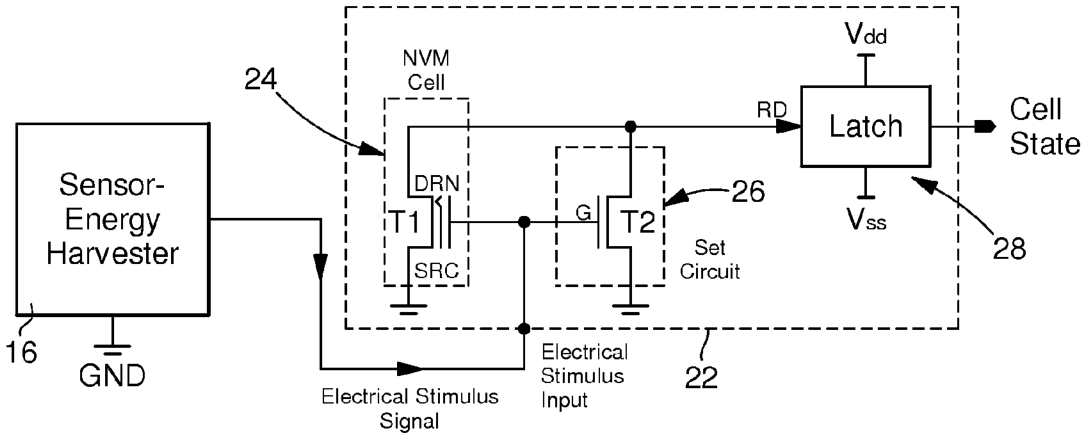
FIG. 3 shows a particular electronic design of the detection device of FIG. 2.

FIG. 3 shows a particular electronic design of the previously described detection device. The non-volatile memory cell 24 is directly set to its written logical state from its initial logical state by an electrical stimulus pulse provided by the energy harvester (sensor) 16. The NVM cell 24 is formed by a first FET transistor T1 having a control gate, a source region SRC and a drain region DRN. The control gate is connected to a stimulus input of the electronic unit 22 receiving the electrical stimulus pulse/signal of said energy harvester. The ground of the electronic unit 22 is defined by the energy harvester/sensor which ground line (not represented) is connected to this electronic unit.

The electronic unit 22 further comprises a set circuit 26 defining a switch arranged between the ground of the electronic unit and the drain DRN of the first FET transistor. This switch is preferably formed by a second FET transistor T2 having a control gate connected to the electrical stimulus input and is turned on when an electrical stimulus pulse is provided to the electronic unit, connecting the drain of the first FET transistor to ground (0 V) and thus allowing the secure setting of the non-volatile memory cell 24 to the logical '1' state.

The electronic unit 22 comprises reading means of said non-volatile memory cell which is active only when supplied by a power source. This reading means is formed by a latch 28 having its input connected to the drain DRN of said first FET transistor and automatically providing at its output, when a power supply is applied by an external device/reader, a signal indicating the state of the NVM cell.

Figure 4:
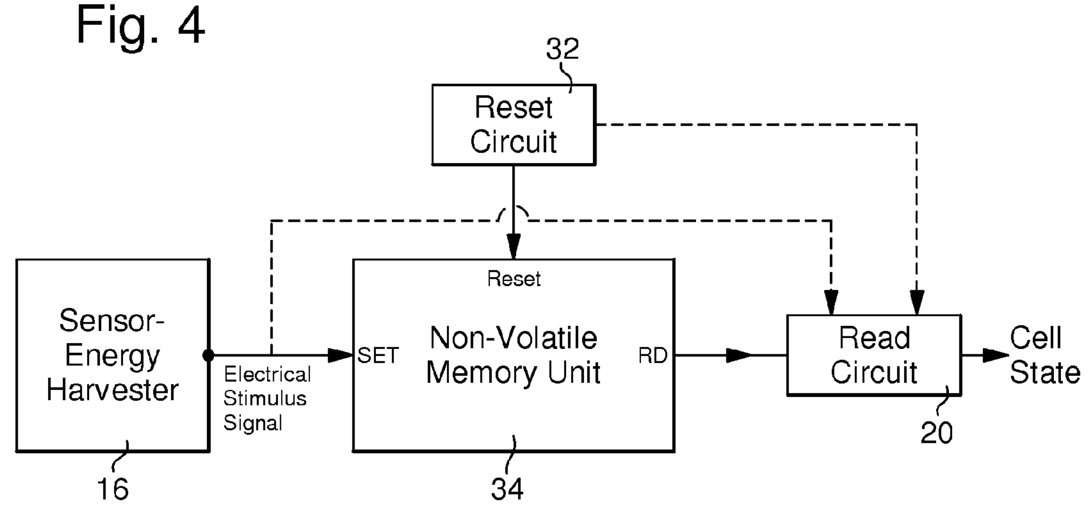
FIG. 4 shows the basic architecture of a second external event detection device without the present invention.

FIG. 4 shows the basic architecture of a further self-powered detection device. In this case, the electronic unit comprises reset means for resetting the non-volatile memory cell.

The electrical energy of the external event is collected at the electrical stimulus input of the electronic unit and a corresponding data is written in the NVM cell 34. This NVM cell has a reset input receiving a reset signal from a reset circuit 32. This reset circuit needs to be power supplied for resetting the memory cell. In a variant, the reset circuit has an input receiving the stimulus input signal.

When power is supplied is present, the reset circuit allows resetting the non-volatile memory cell after an external event has been detected and this cell set. This allows reuse of the external event detector after one detected external event. Let us consider the case of a security device in which the detection device according to this embodiment has been tampered with. When the detection device is supplied following a tamper event, the read circuit will enable a read of the non-volatile memory cell and the read output will be a logical '1'. Once this tamper event has been acknowledged, the user can reset the non-volatile memory cell through the reset circuit 32.

The reset circuit and the read circuit are used when the detection device is supplied by a power source. These elements are preferably designed so that they will not interfere with the setting of the memory cell during a tamper event (whether the supply is present or not).

Figure 5:
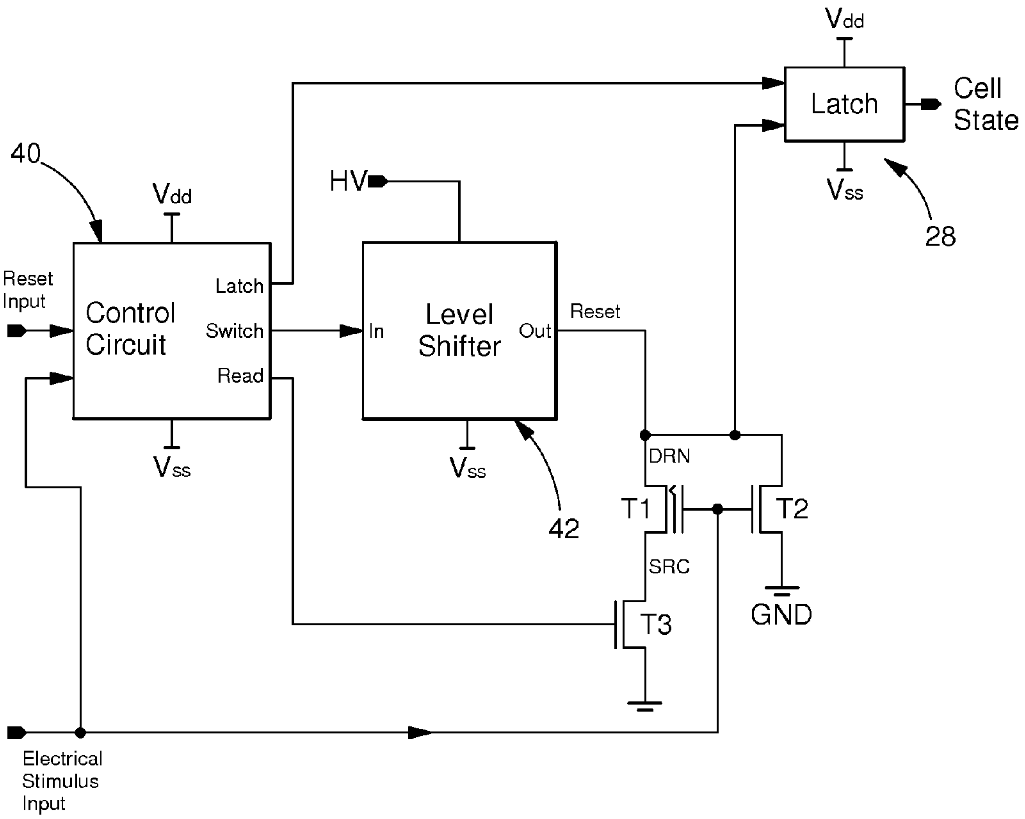
FIG. 5 partially shows a particular electronic design of the detection device of FIG. 4.

FIG. 5 shows a particular electronic design of the detection device of FIG. 4. The reset circuit is formed by a control circuit 40 and a level shifter 42 receiving a High Voltage (HV). The level shifter is controlled by the control circuit 40. In a variant, the level shifter can be formed by a high voltage inverter (CMOS Inverter). When the detection device is supplied, the latch 28 will automatically have a logical state corresponding to the logical state of the memory transistor T1. If this transistor T1 is set, the user takes note that a given external event has been detected. Then, the user can reset the memory cell so as to reuse the detection device. When a reset signal is received at the reset input of the control circuit 40, then the outputs of this control circuit are switched as follows:

- The latch output is driven to 0 V instructing the latch to turn OFF for protecting itself from the high voltage which will be applied to the drain DRN of transistor T1;
- The read output is driven to 0 V, turning OFF transistor T3 and thus disconnecting the source SRC of transistor T1 from ground;
- The switch output is driven high to the power supply level and thus the level shifter 42 provides at its output a High Voltage signal for erasing the memory cell which returns to its non-tampered state.

After the reset step has been terminated, the level shifter output is turned OFF (high impedance so that it is not driven), the latch output is driven high and the read output is driven high again. Thus, the latch will then also be reset by the voltage level of the drain of memory cell T1. Then, the power supply can be removed and the detection device is again reusable as a self-powered detection device.

Figure 6:
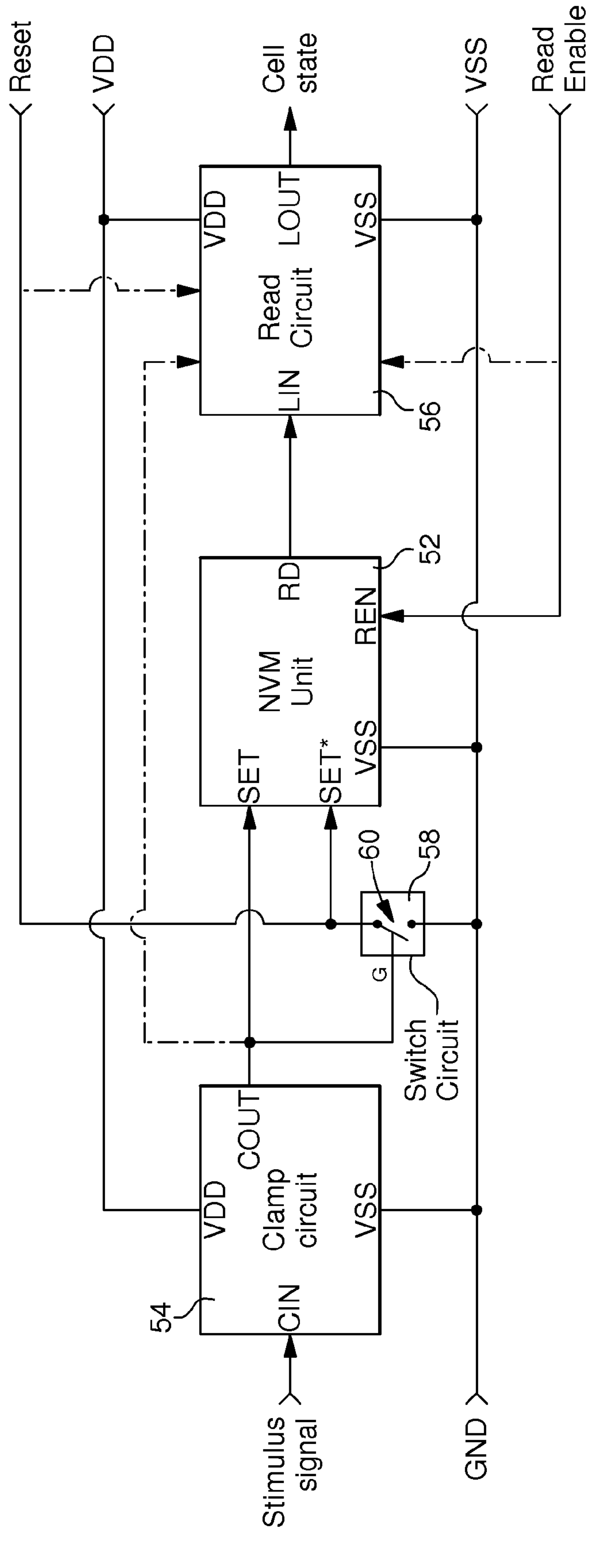
FIG. 6 partially shows the general architecture of a self-powered detection device according to the invention with a NVM unit which can have different arrangements according to the following figures.

In the following part of the description, an embodiment of the invention and some variants will be described. FIG. 6 show partially a general architecture of a self-powered detection device according to the present invention on the basis of which the variants will be described. The sensor/energy harvester is not represented in this FIG. 6; only two lines coming from such a sensor/energy harvester are shown. These two lines define two inputs of the electronic circuit of FIG. 6, of which the first one receives a voltage stimulus signal from the sensor when it is activated and the second one is connected to the ground (GND) of this sensor. These two inputs are those used in a detection mode of the self-powered detection device wherein no other supply source than the sensor is used for detecting at least one physical or chemical action or phenomenon applied to this sensor with at least a given strength or intensity, the electrical energy of an electrical stimulus pulse generated by such a physical or chemical action or phenomenon applied on the sensor being used.

The voltage stimulus signal resulting from the electrical stimulus pulse is transferred to the electronic circuit of FIG. 6 and used to set/write at least a NVM cell of the NVM unit 52. NVM unit 52 is arranged for storing in said NVM cell a bit of information relative to the detection by the sensor, during a detection mode of the self-powered detection device, of at least one physical or chemical action or phenomenon applied to it with at least a given strength or intensity and resulting in a voltage stimulus signal provided between a set control terminal SET and a base terminal SET * of the NVM unit 52 with at least a given set voltage. Thus, in the detection mode, the voltage stimulus signal generated by a physical or chemical action or phenomenon applied to the sensor passes through the clamp circuit 54 and is provided to the SET input of the NVM unit 52. As in the other embodiments, the detection device of FIG. 6 comprises a read circuit 56 which is formed in a preferred variant by a latch already described.

According to the present invention, the self-powered detection device of FIG. 6 comprises a clamp circuit 54 located between the sensor and the NVM unit 52. This clamp circuit is arranged for passing voltage signals with at least a given set voltage for setting a NVM cell incorporated in the NVM unit and with a predefined polarity corresponding to a set polarity of this NVM cell and for blocking, i.e. preventing or clamping, other voltage signals having approximately said given set voltage or an higher voltage and an inverse polarity relative to the set polarity of said NVM cell, in order to avoid a possible erase of the NVM cell by such other voltage signals. This clamp circuit thus allows only electrical stimulus pulses coming from the sensor and resulting from a physical or chemical action or phenomenon, in particular a tamper event, detected by this sensor to pass from its input CIN to its output COUT, i.e. to go through this clamp circuit such that once a physical or chemical action or phenomenon, in particular a tamper event, is detected by this sensor, the record of this detection cannot be undone via the input CIN which is intended for receiving the voltage stimulus signal. This protection is very interesting for tamper event detection because the input CIN, without such a clamp circuit, could be used by a tamperer for erasing the NVM cell, which has stored such a tamper event, by sending with an external device an electrical pulse with an inverse polarity relative to the polarity of the stimulus pulses generated by the sensor.

The self-powered detection device of FIG. 6 comprises a switch circuit 58 formed at least by a switch 60 arranged in the path between the ground GND of the sensor and the base terminal SET * of the NVM unit 52, the control gate G of this switch circuit being electrically connected to the set control terminal SET at least in the detection mode. It is to be noted that, in a variant not represented, the gate G of the switch circuit 58 can be disconnected from the SET terminal in other modes of the detection device (e.g. reset mode or read mode). The switch 60 is selected so as to be ON when the control gate G of the switch circuit 58 receives a voltage stimulus signal from the sensor with at least said given set voltage. Thus, in this case, the switch connects the base terminal SET * to GND (ground of the sensor) so that the voltage applied between the terminals SET and SET * of the NVM unit corresponds substantially to the whole voltage of the voltage stimulus signal, which ensures the setting of the at least one NVM cell in the NVM unit 52. The switch circuit is important for the detection device because it allows the implementation of further functions in an efficient way, in particular for reading the state of the NVM cell or for resetting it, where the base input SET * is used for such functions and must thus be disconnected from the ground of the sensor or the VSS terminal of a supply source intervening for such functions. The switch circuit 58 can in a variant be formed by a single switch element 60, in particular a transistor T2 as shown in FIGS. 3 and 5 and already described. Thus, hereafter, the switch 60 is also named 'transistor T2' or simply 'T2', but should not be interpreted as a limitation.

During a detection mode (without power supply), the voltage stimulus signal is routed to input SET of the Non-Volatile Memory (NVM) unit 52. Simultaneously, switch 60/transistor T2 is turned on driving input SET * to the same potential as GND (0V). A NVM cell within the NVM unit 52 is then written to the "set" data state (flag). In the read mode of the self-powered detection device wherein at least the read circuit 56 is powered by a temporary power source, for reading out the cell state, the input REN 'Read Enable' is driven high turning on a path for current to flow through output RD (Read output of the NVM unit). A high current represents one cell state of two possible cell states while a low current represents the other of the two cell states. The read circuit, in particular a Latch as shown in FIGS. 3 and 5, senses the amount of current and drives output LOUT to either a logical one or a logical zero level. In a reset mode of the self-powered detection device wherein at least the reset circuit is powered by a temporary power source, for resetting the NVM cell, the input SET * of the NVM unit 52 is driven high under user control (through a reset circuit not shown) while COUT of the Clamp circuit 54 is driven low in order to put switch 60 (transistor T2) in its OFF state and thus to ensure that the SET * terminal is disconnected from GND, respectively from VSS of the power source. In FIG. 6, the switch circuit 58 is connected to GND of the sensor and also to VSS of a temporary power source used in the read mode and the reset mode. In a variant, this switch circuit is connected only to GND and not to VSS.

Figure 7:
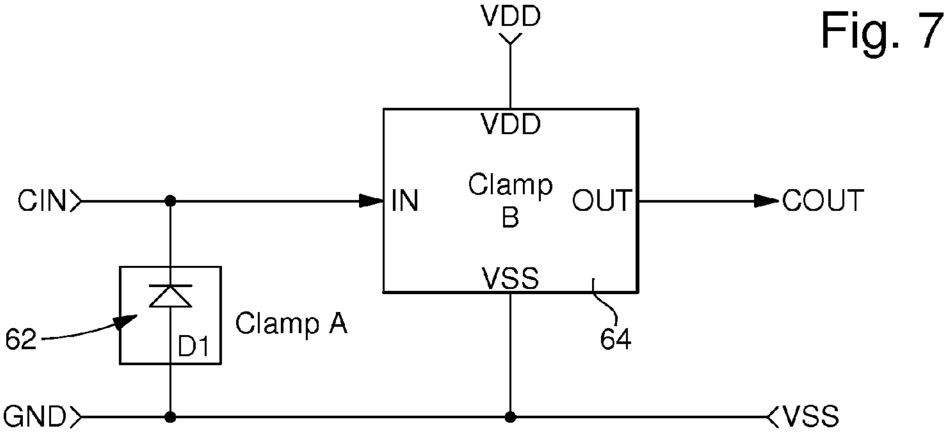
FIG. 7 shows a variant of a clamp circuit arranged between the sensor of the self-powered detection device and the NVM unit in the embodiment of FIG. 6.

FIG. 7 is a preferred implementation of a clamp circuit according to the present invention. In this example, there are two subcircuits 62 and 64, respectively Clamp A and Clamp B. Clamp A is formed by a diode D1 which is arranged between the Ground (GND) of the sensor and a stimulus input of the electronic circuit of FIG. 6. A set line connects, via Clamp B, this stimulus input to the set control terminal (SET input) of the NVM unit 52 and provides the voltage stimulus signal to this NVM unit.

Clamp A is first a negative clamp, which prevents the stimulus input from going negative with respect to VSS by more than one diode voltage drop (~0.6V) with or without the device being supplied. Without a negative clamp, a tamperer could allow a stimulus pulse to be emitted by the sensor to set the NVM cell (when this tamperer opens a protected device or enters a protected zone), extract information or material from the device/zone under protection or interfere with its operation, and then reset the NVM cell by applying a negative pulse of sufficient amplitude thereby removing any information that tampering occurred. The negative pulse could be provided from a pulse generator to the Set terminal after disconnecting the sensor from it. Then, the sensor could be reconnected. Clamp A is designed to prevent this type of intervention by a tamperer. Such a case thus especially concerns a detection device wherein the sensor circuit is not integrated with the NVM unit in a same integrated circuit.

Clamp A is also a positive clamp. If the amplitude of the stimulus pulse is too high, then damage to transistors and other on-chip devices may occur or a phase change (PC) NVM cell may be inadvertently reset (see also the description of this PC NVM cell later). The diode of Clamp A is designed to break down shunting charge to VSS at a given positive voltage ($V_{BREAKDOWN}$) high enough to allow a set of the NVM cell but low enough to prevent damage or a reset in the case of a PC NVM. It is desirable that the diode be designed and laid out to pass the charge without itself being damaged. There are many well-known design and layout techniques that can be applied from the area of electrostatic discharge (ESD) protection design. The Clamp A circuit 62 could in a different variant be formed by transistors controlled by the voltage stimulus signal in the detection mode, so as to perform the functions of Clamp A.

Clamp B is first a ground clamp. Its purpose is to drive COUT to the VSS level whenever CIN is approximately 0V. CIN can be at 0V potential if the sensor outputs 0V or if CIN is not driven or connected but discharges to 0V through a reverse-biased diode like D1 in Clamp A. It is desirable that a voltage stimulus signal can be applied at any time through it to the SET input. This would allow for tamper detection during read and reset operations.

During reset, the SET input must be preferably at a stable, unalterable 0V level in order to ensure that a large enough voltage (VReset-min) can be developed to reset the NVM cell. If SET is not well-driven to 0V, then it may couple high due to parasitic coupling capacitance to high-going signals within the powered device, reducing the reset voltage below VReset-min. The same is true for a read operation in that SET must preferably be stable, unalterable, and 0V in order to provide a source of electrons for a read current or a known, stable voltage for a FET gate controlling read current. If the impedance looking towards the sensor from input pin CIN is very high, for example in the case of a sensor that collects and delivers electrostatic charge or when resetting during wafer test, then a circuit like that in Clamp B is required for successful reset and read operations under device power supply.

Figure 8:
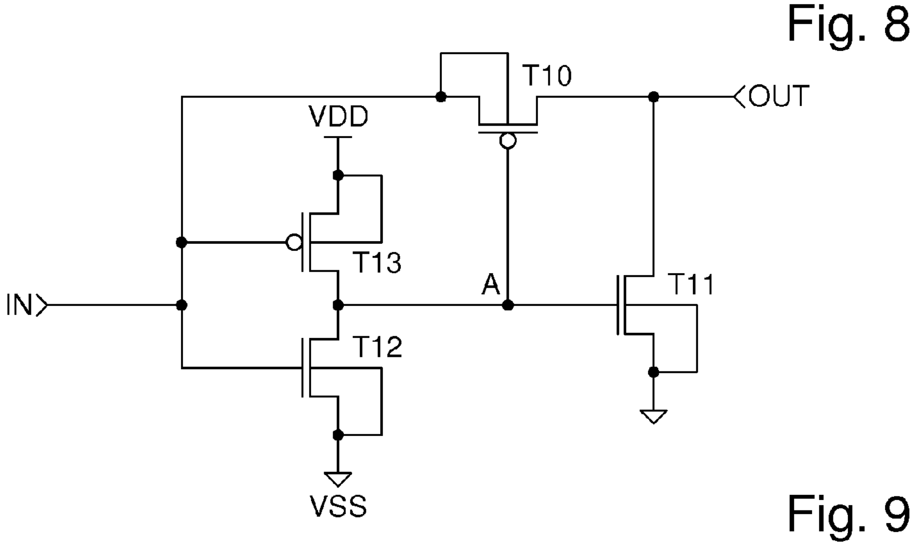
FIG. 8 shows a subcircuit of the clamp circuit of FIG. 7.

FIG. 8 is a schematic diagram of an example implementation of the Clamp B subcircuit 64 of FIG. 7. This subcircuit 64 comprises two switches respectively formed in this variant by two transistors T10 and T11. The first switch T10 is arranged on the set line between the sensor and the set control terminal of the NVM unit 52 (FIG. 6), thus allowing to disconnect the NVM unit from the sensor output providing the voltage stimulus voltage. The second switch T11 is arranged between the set line and the ground or determined low level of a temporary power source VSS. The control of these two switches is operated by two further transistors T12 and T13 which define a voltage level applied to the control gate of the two transistors T10 and T11. The clamp operation is as follows: For the voltage of IN (V(IN)) less than approximately VTRIP=V(VDD)/2, T13 is turned on and T12 is turned off driving node A high to turn on T11 and turn off T10 causing OUT to be driven to the VSS level (0V). For V(IN)≧VTRIP, T13 is off and T12 is on driving node A low, which turns off T11 and turns on T10 thus connecting OUT to IN. VTRIP defines an intermediate voltage level between VSS and VDD or a temporary power source.

In the case where V(VDD) is approximately 0V (detection mode without power supply source), OUT is not driven by T10 or T11 if IN is low. No set operation occurs when IN is low. If an external event is detected and a stimulus pulse is applied to IN, then IN goes high turning on T12 causing node A to be driven low allowing T10 to turn on while T11 is off. Therefore, the stimulus pulse is passed to the SET terminal to set the NVM cell without a power supply for the device.

A negative stimulus pulse applied to IN is generally clamped to a diode voltage drop by a (parasitic) diode existing between the N-well connection of T10 and the grounded p-type substrate preventing a reset of the NVM cell, as clamp A does. Likewise, a reset of the NVM cell is not possible through Clamp B by driving VDD negative because there is a (parasitic) diode from N-well to grounded p-substrate that prevents VDD from going negative with respect to VSS by more than a diode drop. The same diode exists for PMOS devices elsewhere whose N-well is tied to VDD.

It is to be noted that there is a certain redundancy in the functions of both subcircuits Clamp A and Clamp B. In some implementations Clamp B can be sufficient for the negative clamping function, i.e. for blocking voltage signals with an inverse polarity relative to the set polarity of the NVM unit and an absolute voltage level over a defined threshold which is inferior to the given set voltage of a cell forming the NVM unit. However, because this function in Clamp B is supported by a parasitic diode, the characteristics of which are often difficult to adjust, the addition of Clamp A in the clamp circuit 54 is more secure. Indeed, it is possible to better determine the characteristics of the diode 62. A configuration with only Clamp B (without Clamp A) can be sufficient for preventing a tamperer to reset in particular a PCRAM NVM cell, if the breakdown of N-well to P+ drain of T10 is properly designed.

An alternative to the Clamp B circuit of FIG. 8 is an NMOS transistor with source connected to VSS, gate connected to a read or reset control signal from the VDD power domain, and drain connected to IN and OUT that also connects to Set. The disadvantage of this last circuit is that without device power a stimulus pulse may couple the gate high enabling a current path to VSS that degrades the stimulus pulse. Another disadvantage is that the stimulus pulse cannot be passed whenever a read or reset operation is being performed.

In summary, the functions of Clamp A are:

- To pass a positive stimulus pulse for the NVM cell set operation without degradation;
- To ensure the blocking (clamping) of a negative ‘stimulus’ pulse preventing a NVM cell reset/erasing operation through the CIN input terminal;
- To block (clamp) positive stimulus pulses greater than $V_{BREAKDOWN}$ thus preventing damage of the electronic circuit and a reset in the case of a PC NVM;
- To accomplish pass and block functions with or without the detection device under temporary power supply.

The functions of Clamp B are:

- To pass a positive stimulus pulse for NVM cell set operation without degradation (with or without device under power supply);
- To clamp SET input to ground for reliable read and reset of the NVM cell (device under power supply);
- To allow a tamper detection during read and reset operations (device under power supply);
- To also block (clamp) a negative ‘stimulus’ pulse preventing NVM cell reset operation (with or without device under power supply) through the CIN input terminal, this function resulting from the integration technology of the transistors.

A configuration with only Clamp A (without Clamp B) and preferably a large capacitor from SET to VSS can be functional enough for a NVFET cell with SET connected to the FET gate and for FeRAM NVM cells.

There are many different types of NVM unit 52 compatible with the general embodiment of FIG. 6. Several possible types with their specific implementation will be hereafter described.

Figure 9:
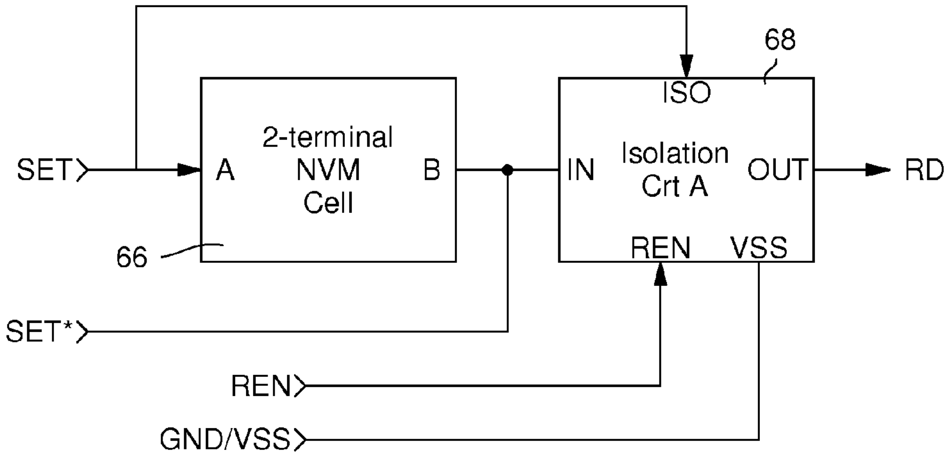
FIG. 9 shows a first embodiment of the NVM unit of FIG. 6 with a NVM cell having only two terminals.

FIG. 9 shows a first embodiment of such a NVM unit with a NVM cell 66 having only two terminals (2-terminal NVM Cell). In the detection mode, the voltage stimulus signal resulting from an electrical stimulus pulse generated by the sensor is applied through input SET to input A of the 2-terminal NVM Cell simultaneous with 0V (GND) on input SET * being applied to input B, as already explained. The subcircuit 68 ‘Isolation Crt A’ isolates SET * from output RD during a set operation (stimulus pulse applied in the detection mode) as well as during a reset operation (reset mode). To read the cell (read mode), SET is driven to 0V by Clamp B when no electrical stimulus pulse is present and thus the switch 60 (FIG. 6) is OFF, REN is driven high, and input IN is connected to output OUT to allow current to flow through subcircuit 68. To reset the cell, SET * is driven high while SET is at 0V. For the read mode and the reset mode, the switch circuit 58 is essential in order to disconnect SET * from GND/VSS.

Figure 10:
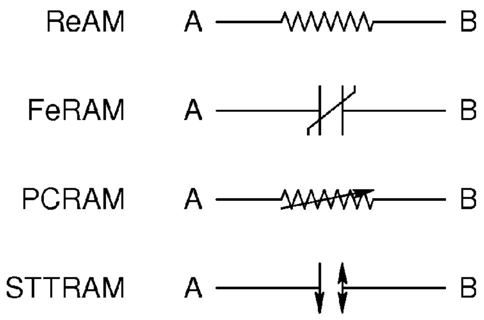
FIG. 10 shows four variants for the NVM cell of FIG. 9.

FIG. 10 shows some known types of 2-terminal NVM cells compatible with the NVM unit of FIG. 9. This FIG. 10 shows one arrangement of the terminals for the NVM cell types listed, but these terminals are interchangeable. The cell types are:

- ReRAM—Resistive Random Access Memory
- FeRAM—Ferroelectric Random Access Memory
- PCRAM—Phase Change Random Access Memory
- STTRAM—Spin-Transfer Torque Random Access Memory.

NVM unit output RD must not be connected to output B of the 2-terminal NVM Cell during a set operation (detection mode) or a reset operation (reset mode). This is because a signal or voltage on input SET * must not be degraded during the set or reset operation by any circuitry connected to RD.

Figure 11:
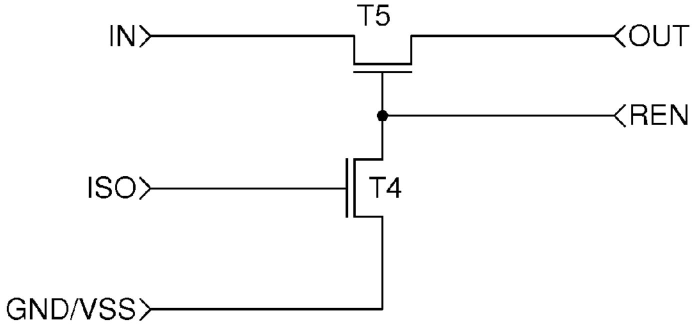
FIG. 11 shows a schematic diagram of a variant of the isolation subcircuit of FIG. 9.

FIG. 11 is a schematic diagram of an example of isolation subcircuit 68 (Isolation Crt A). During a set operation ISO is high, transistor T4 is on and the gate of transistor T5 is connected to VSS. T5 is then turned off isolating IN and OUT. This isolation operation is possible with or without a supporting supply (VDD). REN, which is in the VDD power supply domain, must be low or high-impedance (not driving) in order to not conflict with T4 driving the gate of T5 low. During a reset operation REN is low, T5 is off isolating IN and OUT. For a read operation, ISO is low because SET is low via Clamp B (FIGS. 7 & 8); REN is high causing T5 to turn on connecting OUT to IN, which allows current to flow.

Hereafter, three cases will be described where the storage means consists of a field effect transistor (FET) containing charge storage material, collectively named Non-Volatile FET (NVFET).

Figure 12:
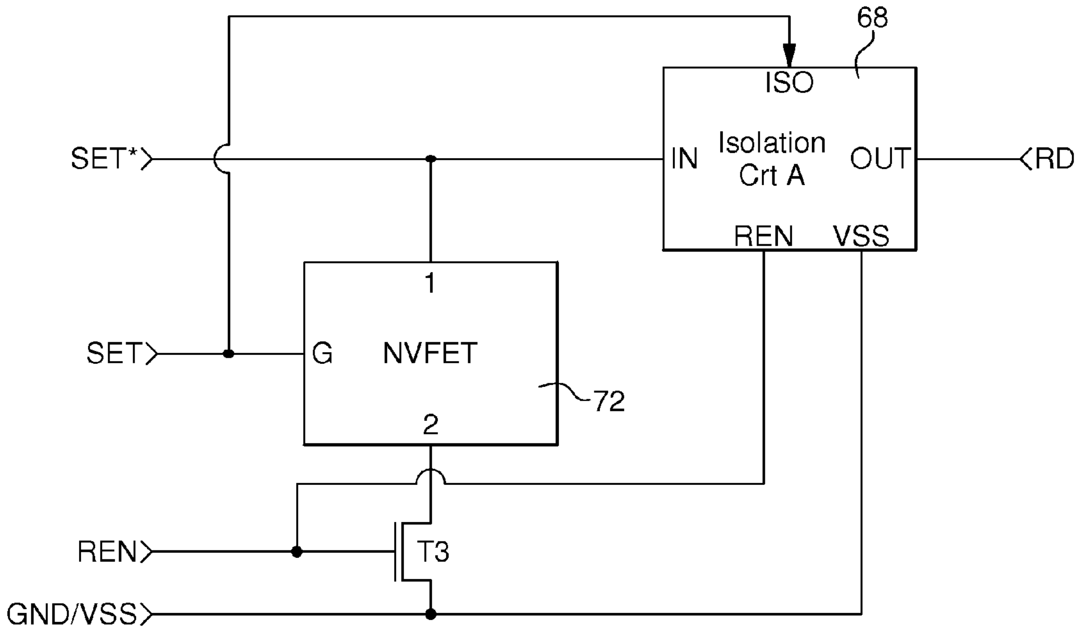
FIG. 12 shows a second embodiment of the NVM unit of FIG. 6 with a NVM cell formed by a NVFET.

FIG. 12 is a diagram of a second embodiment of the NVM unit 52 of FIG. 6 with a NVFET cell 72, where the stimulus pulse is applied to the control gate G of the NVFET. This NVFET further comprises two diffusions defining two inputs 1 and 2. During the set operation (detection mode), the stimulus pulse is routed via input SET to the Gate G of the NVFET cell. At the same time, input SET * is driven low by switch 60 (FIG. 6), which in turn drives input 1 of the NVFET low. Subcircuit 68 'Isolation Crt A' isolates SET * from RD except during a read operation (read mode). Electrons are stored in the charge storage material causing the threshold voltage of NVFET to be high and current low during a read operation.

During a reset operation (reset mode), SET * is driven high causing input 1 of NVFET 72 to be driven high. At the same time, SET is driven low by subcircuit 64 'Clamp B' (FIGS. 7 & 8) driving input G low and thus the switch 60 (FIG. 6) is OFF. Electrons tunnel out of the charge storage material leaving it positively charged, reducing its threshold voltage, and causing high current to flow during a read operation. During a read operation (read mode) when no electrical stimulus pulse is present, Clamp B drives input SET low, which holds input G of NVFET 72 low. REN is high turning on T3 and connecting input 1 of the NVFET to output RD in order to allow current to flow for sensing by the read circuit (Latch circuit). For the read mode and the reset mode, the switch circuit 58 is essential in order to disconnect SET * from GND/VSS.

Figure 13:
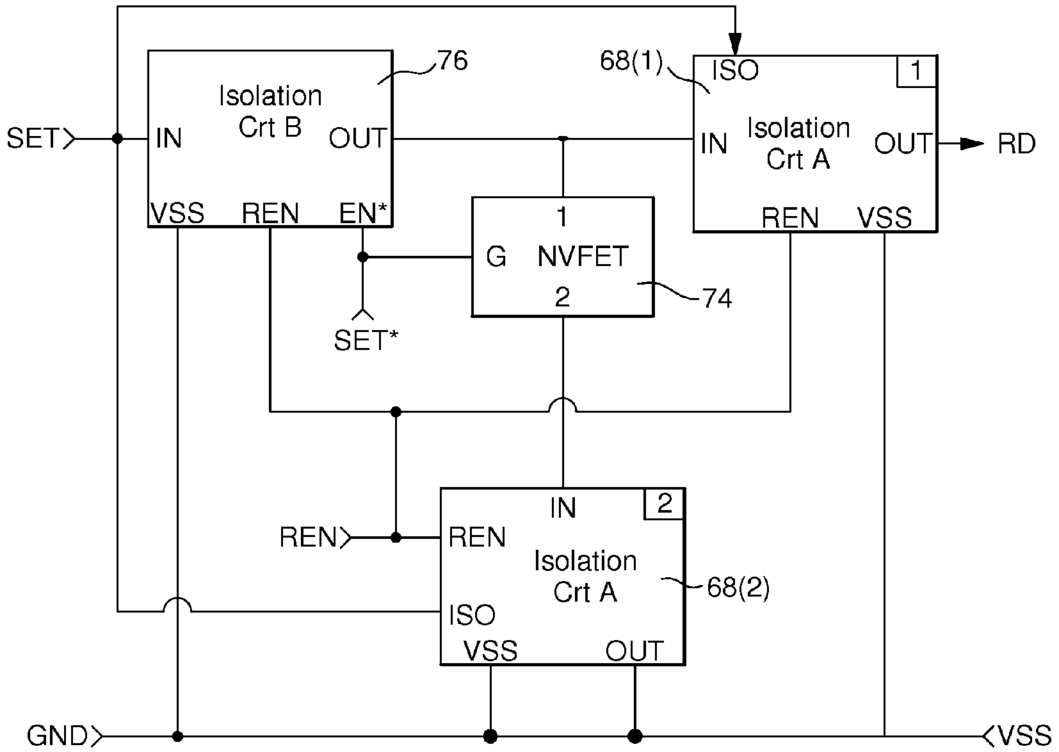
FIG. 13 shows a third embodiment of the NVM unit of FIG. 6 with a NVM cell formed by a NVFET.

FIG. 13 is a diagram of a third embodiment of the NVM unit 52 of FIG. 6 with a NVFET cell 74, where a stimulus pulse is applied to one diffusion (Input 1) of the NVFET and where the read circuit senses, i.e. the read occurs, at the same diffusion. During the set operation (detection mode), the stimulus pulse is routed through the subcircuit 76 'Isolation Crt B' to input 1 of NVFET 74. At the same time, SET * is driven low by transistor T2 (switch 60 of FIG. 6), which in turn drives input G of the NVFET low. Because REN is low or high impedance (not driving) and SET is high, isolation subcircuits 68(1) and 68(2) isolate IN from OUT. Both subcircuits 68(1) and 68(2) correspond to the subcircuit 68 'Isolation Crt A' shown in FIG. 11. The isolation subcircuit 68(2) prevents any leakage current through NVFET 74 that may degrade the level of the stimulus pulse routed to the diffusion. The isolation subcircuit 68(1) isolates RD from input 1 of the NVFET also to prevent degradation of the stimulus pulse routed to the diffusion.

During a reset operation, SET is driven low by Clamp B (FIGS. 7 & 8) and thus the switch 60 (FIG. 6) is OFF. At the same time SET * is driven high causing input G of NVFET 74 to be driven high. Because SET * is high, subcircuit 76 connects SET to input 1 of the NVFET, driving input 1 low. Electrons tunnel into the charge storage material leaving it negatively charged, raising its threshold voltage, and causing low current to flow during a read operation. For the reset mode, the switch circuit 58 is essential in order to disconnect SET * from GND/VSS.

During a read operation, SET * must hold input G of NVFET 74 low via the Reset line (FIG. 6). REN is high causing subcircuit 68(2) to connect input 2 of NVFET 74 to VSS in order to allow current to flow for sensing. Subcircuit 68(1) connects input 1 of NVFET to RD. Input REN causes subcircuit 76 'Isolation Crt B' to isolate SET, which is low, from input 1 of the NVFET.

Figure 14:
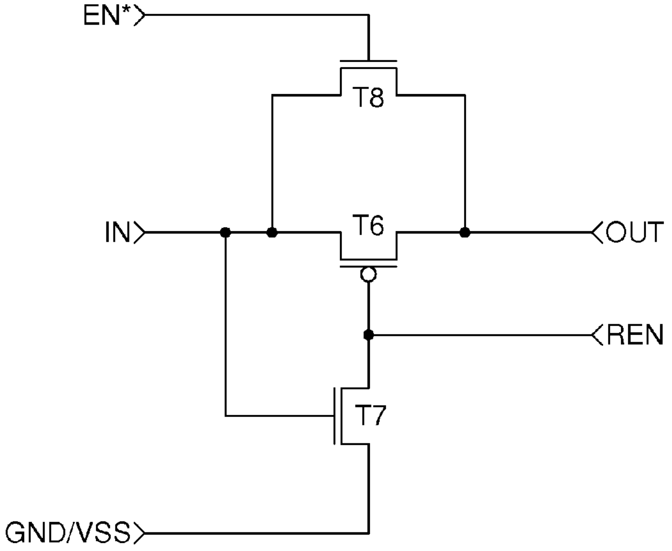
FIG. 14 shows a schematic diagram of a variant of the subcircuit 'Isolation Crt B' of FIG. 13.

FIG. 14 is a diagram of a variant of subcircuit 76 'Isolation Crt B'. Input SET must not be connected to input 1 of NVFET during a read operation, but must pass to this input 1 the voltage stimulus signal during a set operation (detection mode without power supply) and 0V during a reset operation (with power supply).

During a read operation, an alternative path for current flow must be prevented. SET * low turns off T8; REN high turns off T6; and IN low turns off T7. Therefore, OUT is isolated from IN. During a set operation, the full voltage—preferably without threshold drop—must be passed from SET to input 1 of NVFET 74. SET * low, which drives input EN *, turns off T8, and IN, which is driven by SET, is high what turns on T6 via T7. REN must be low or high-impedance (not driving) in order to not conflict with T7 driving the gate of T6 low. Therefore, a high level on SET forces IN to be connected to OUT. During a reset operation, 0V must be passed from SET to input 1 of NVFET 74. SET * high turns on T8, EN low turns on T6, and IN, which is driven by SET, is low which turns off T7. Therefore, Clamp B (FIGS. 7 & 8) drives SET low and 0V is passed from IN (input 1 of NVFET) to OUT.

Figure 15:
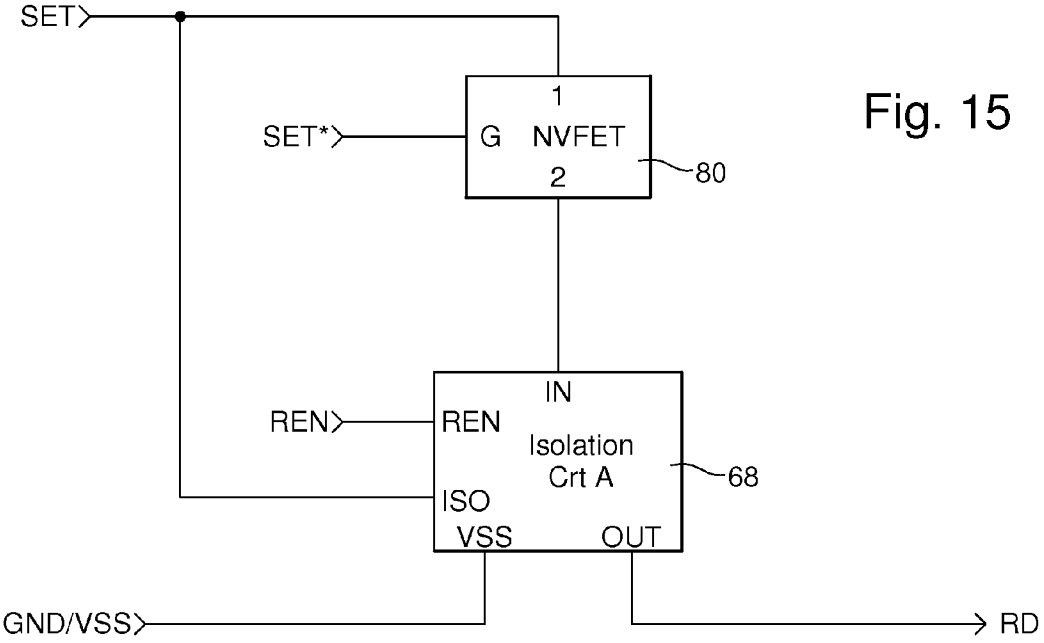
FIG. 15 shows a fourth embodiment of the NVM unit of FIG. 6 with a NVM cell formed by a NVFET.

FIG. 15 is a diagram of a fourth embodiment of a NVM unit 52 (FIG. 6) with a NVFET 80, where a stimulus pulse is applied to one diffusion (input 1) of the NVFET and where the read occurs via the other opposite diffusion (input 2) of this NVFET. During the set operation (detection mode where no power supply is provided), the stimulus pulse is routed via input SET to input 1 of NVFET 80. At the same time, SET * is driven low by transistor T2 (switch 60), which in turn drives input G of the NVFET low. Because REN is low or high-impedance (not driving) and SET is high, the isolation subcircuit 68 isolates IN from OUT thus preventing any leakage current through the NVFET to output RD that may degrade the level of the stimulus pulse routed to the diffusion.

During a reset operation, SET is driven low by the Clamp circuit (FIG. 6), driving input 1 low, and thus switch 60 (FIG. 6) is OFF. At the same time, SET * is driven high causing input G of NVFET 80 to be driven high. Electrons tunnel into the charge storage material leaving it negatively charged, raising its threshold voltage, and causing low current to flow during a read operation. For the reset mode, the switch circuit 58 is essential in order to disconnect SET * from GND/VSS.

During a read operation, input SET * holds input G of NVFET 80 low. When no electrical stimulus pulse is present, Clamp B (FIGS. 7 & 8) drives SET low while REN is high causing subcircuit 68 to connect input 2 of the NVFET to RD in order to allow current to flow for sensing.

There are at least two compatible NVFET types which can be implemented in the second, third and fourth embodiments of respectively FIGS. 12, 13 and 15:

1) Floating gate; and
2) nitride-based charge storage or SONOS (polySilicon-silicon Oxide-silicon Nitride-silicon Oxide-Silicon substrate).

In the floating gate type, a polysilicon gate is sandwiched between two oxide layers which are between a polysilicon gate and a single crystal silicon substrate. The floating gate stores electrons after a high field caused by high voltage induces tunneling. The tunneling can occur a) through a tunnel oxide fabricated over one of its two diffusions, or b) through a tunnel oxide present above the region where a channel is formed when the device is turned on.

In the SONOS type, electrons are stored in a nitride layer positioned similarly to a floating gate. Electrons tunnel through oxide above a channel.

Figure 16:
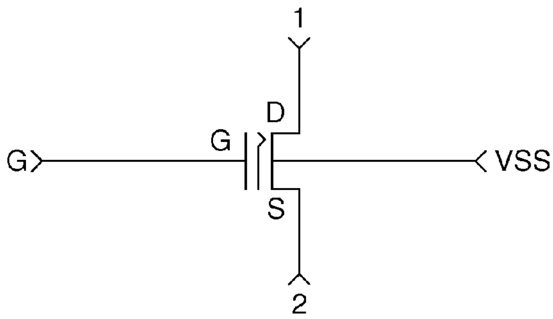
FIG. 16 shows a first configuration of a NVFET cell which can be used in the embodiments of FIGS. 12, 13 and 15.
Figure 17:
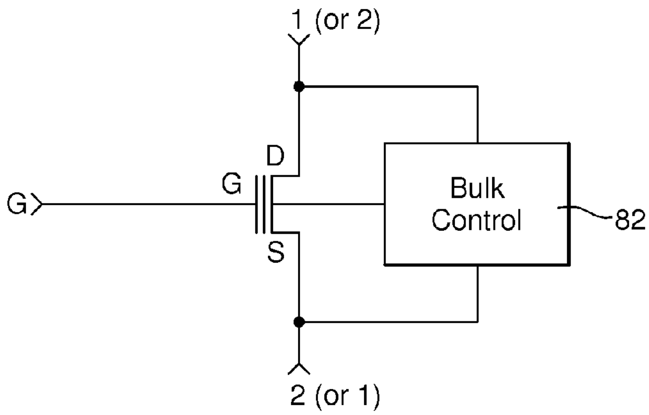
FIG. 17 shows a second configuration of a NVFET cell which can be used in the embodiments of FIGS. 12, 13 and 15.

Therefore, there are two configurations for NVFETs which can be used in the second, third and fourth embodiments of the NVM unit described here-above:

1) Floating gate with tunnel oxide over the drain diffusion as shown in FIG. 16; and 2) Floating gate with tunnel oxide over channel or SONOS as shown in FIG. 17.

For the first configuration (FIG. 16), the drain D of the NVFET corresponds to input 1 (FIGS. 12, 13 and 15). Because tunneling can occur anywhere along the channel for the second configuration (FIG. 17), inputs 1 and 2 (FIGS. 12, 13 and 15) may be interchanged. Thus, in the second configuration, input 1 can be the drain D or the source S of the NVFET. In this case, to erase the cell, the bulk must follow the drain and source to a high voltage and yet be connected to VSS while reading. This function requires a bulk connection control circuit 82 named 'Bulk Control'. There are well known circuits to perform this function.

Figure 18:
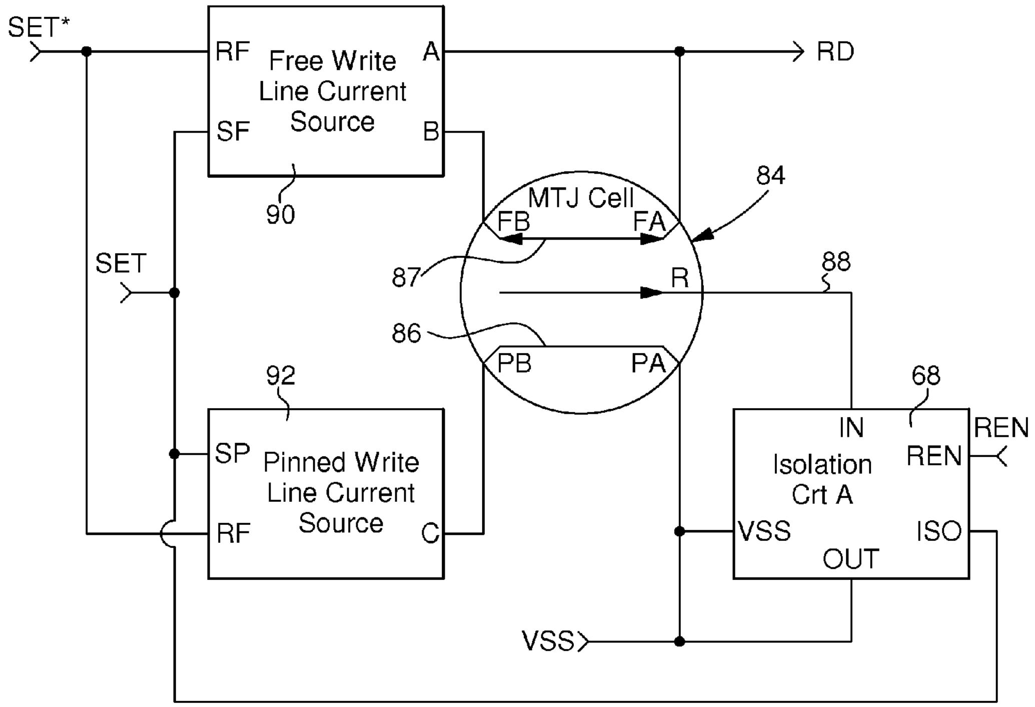
FIG. 18 shows a fifth embodiment of the NVM unit of FIG. 6 with a NVM cell formed by a MTJ.

Another type of NVM cell compatible with the general case described in FIG. 6 is a Magnetic Tunnel Junction (MTJ). FIG. 18 is a diagram of a fifth embodiment of a NVM unit with a MTJ cell 84. The MTJ consists of a magnetic material layer that is free to realign its domains with an applied magnetic field and another magnetic material layer whose domains are pinned. When the free layer domains are aligned parallel to the pinned magnetic layer, electrons tunnel between the two magnetic material layers under the influence of an electric field. In this implementation, a set operation (detection mode) is performed as follows:

A voltage stimulus signal induces current flow from the pinned write line 86 to ground, cancelling pinned layer's magnetic field;

The same voltage stimulus signal induces current flow through the free write line 87 from one terminal to the other, forcing the free layer's domains to the "set" state.

During a read operation, the set state is sensed as either current flow or no current flow from the free layer electrode to the pinned layer electrode through the tunnel junction.

The stimulus pulse is routed from SET to input SF of subcircuit 90 'Free Write Line Current Source' and input SP of subcircuit 92 'Pinned Write Line Current Source'. Any of several well known circuits can be used for the current sources 90 and 92. The voltage stimulus signal routed to input SP via SET supplies power for the current sourced to output C of subcircuit 92, which is routed to input PB of MTJ Cell 84, then through the pinned write line and out of output PA to VSS. SET *, held low by transistor T2 (switch 60), is routed to input RF. This input holds output B of subcircuit 90 to 0V. The voltage stimulus signal routed to input SF via SET supplies power for the current sourced to output A, which is routed to input FA of MTJ cell 84, then through the free write line and out of output FB. The current then flows into input B of subcircuit 90 and is then routed to RF and its connection to SET *.

During a reset operation, SET is low and thus switch 60 (FIG. 6) is OFF, but SET * is high forcing current through output B of 'Pinned Write Line Current Source' 92. SET low also forces output A low with current sourced from output B under control of SET * and RF forcing current from FB to FA within the MTJ Cell 84 through the free write line 87. The direction of this current flow is opposite to that of a set operation. During a read operation, the 'Free Write Line Current Source' 90 is off via Clamp B (FIGS. 7 & 9) holding SET low when no electrical stimulus pulse is present, and RD supplies a voltage and a sense current to FA. Isolation subcircuit 68 (Isolation Crt A) connects terminal R of line 88, located in MTJ Cell 84 between pinned line 86 and free line 87, through IN to OUT, which is connected to VSS, when REN goes high for sensing current (read mode). For the reset mode, the switch circuit 58 is essential in order to disconnect SET * from GND/VSS.

What is claimed is:

1. A self-powered detection device comprising a Non-Volatile Memory unit formed at least by a NVM cell and a sensor which is activated by a physical or chemical action or phenomenon, this sensor forming an energy harvester that transforms energy from said physical or chemical action or phenomenon into an electrical stimulus pulse, said NVM unit being arranged for storing in said NVM cell, by using the electrical power of said electrical stimulus pulse, a bit of information relative to the detection by said sensor, during a detection mode of the self-powered detection device, of at least one physical or chemical action or phenomenon applied to it with at least a given strength or intensity and resulting in a voltage stimulus signal provided between a set control terminal and a base terminal of said NVM unit with at least a given set voltage, the self-powered detection device comprising a read circuit or being arranged to be coupled to such a read circuit; wherein this self-powered detection device further comprises a clamp circuit located between said sensor and said NVM unit, this clamp circuit being arranged for passing said voltage stimulus signal on a set line connecting the sensor and said set control terminal of the NVM unit, this voltage stimulus pulse having a polarity corresponding to a set polarity of said NVM cell, and for blocking other voltage signals having approximately an amplitude corresponding to said set voltage or higher and an inverse polarity relative to the set polarity of said NVM cell, in order to avoid a possible erase of this NVM cell by such other voltage signals.

2. The self-powered detection device according to claim 1, wherein the clamp circuit comprises a diode arranged between the ground of the sensor and said set line.

3. The self-powered detection device according to claim 1, wherein the clamp circuit is arranged also for blocking voltage signals with the set polarity and having a voltage amplitude over a certain threshold which is higher than said set voltage, in order to protect the NVM unit by preventing damage to the detection device.

4. The self-powered detection device according to claim 2, wherein said diode is designed to break down at a certain threshold high enough to allow a set of said NVM cell but low enough to prevent damage of the detection device.

5. The self-powered detection device according to claim 1, wherein said clamp circuit is further arranged for maintaining its output to the ground or to a determined low level voltage in a read mode or in a reset mode of the detection device where this detection device is power supplied by a temporary power source, this clamp circuit thus further defining a ground or determined low level clamp.

6. The self-powered detection device according to claim 5, wherein the clamp circuit comprises a first switch and a second switch, the first switch being arranged on said set line between the sensor and the set control terminal of the NVM unit, thus allowing to disconnect the NVM unit from the sensor, the second switch being arranged between the set line and the ground or determined low level voltage of a temporary power source, these first and second switches being controlled so that when the first switch is turned on, or respectively turned off, the second switch is turned off, or respectively turned on, and so that the first switch is turned on when the clamp circuit receives said voltage stimulus signal when supplied by the temporary power source or not supplied.

7. The self-powered detection device according to claim 6, wherein said first and second switches are respectively formed by two complementary transistors, the control gates of these two transistors being controlled by a control signal provided by a control part of said clamp circuit, this control part being arranged so that the control signal has a first state when the amplitude of the voltage signal inputting the clamp circuit is higher than a defined intermediate voltage of said temporary power source and a second opposite state when this amplitude is lower than this intermediate voltage.

* * * * *